TWO-DIODE MONOSTABLE CIRCUIT

Filed Sept. 20, 1960

INVENTOR.
Richard H. Bergman
BY
Carl V. Olson
ATTORNEY

United States Patent Office 3,119,937

Patented Jan. 28, 1964

3,119,937

TWO-DIODE MONOSTABLE CIRCUIT

Richard H. Bergman, Riverton, N.J., assignor to Radio Corporation of America, a corporation of Delaware Filed Sept. 20, 1960, Ser. No. 57,218

7 Claims. (Cl. 307—88.5)

This invention relates to pulse circuits, and more particularly to monostable pulse circuits which are useful in high speed data processing apparatus by virtue of incorporating negative resistance diodes such as tunnel diodes.

It is a general object of this invention to provide an improved circuit capable of large gain and very high speed operation in translating an input trigger pulse to an output pulse of predetermined width.

In one aspect the invention comprises positive and negative direct current bias terminals between which a series circuit is connected including a first tunnel diode, an output terminal, a coupling resistor and a second tunnel diode. The direct current bias voltage applied across the series circuit has a value with relation to the characteristic of the two tunnel diodes such that when one diode is in a high voltage state, the other is in a low voltage state. The first diode is normally in a high voltage state and the second diode is normally in a low voltage state. An inductor is connected from the output terminal to a point of reference potential. An input signal is applied to the second tunnel diode to cause it to switch to a high voltage state. The switching of the second diode acts through the coupling resistor to cause the firs tunnel diode to switch to a low voltage state. The first tunnel diode remains in the low voltage state for a period of time determined primarily by the value of the inductor, and then it returns to its high voltage state and causes the second diode to return to its low voltage state. The output pulse has a current amplitude sufficient to simultaneously operate several succeeding tunnel diode circuits such as may be included in the logic section of an electronic data processing apparatus.

These and other objects and aspects of the invention will be apparent to those skilled in the art from the following more detailed description taken in conjunction with the appended drawings wherein.

Figure 1:
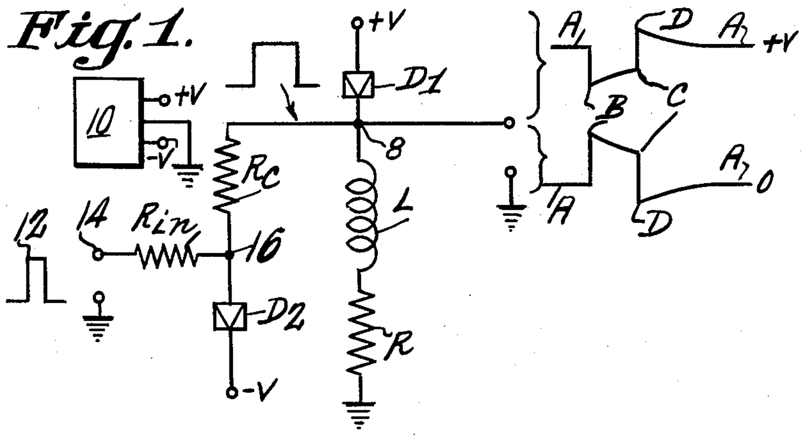
FIGURE 1 is a circuit diagram of a two-diode monostable circuit constructed according to the teachings of the invention.

The monostable circuit shown in FIGURE 1 includes a positive direct current bias terminal +V and a negative direct current bias terminal —V between which there is connected, in series, a first diode $D_1$, an output terminal 8, a coupling resistor $R_c$ and a second diode $D_2$. The bias terminals +V and —V are supplied with bias potentials from a source 10. An inductor L and a resistor R are connected in series from the output terminal 8 to a point of reference or intermediate potential. The diode $D_1$, the inductor L, and resistor R constitute a simple monostable circuit.

Figure 4:
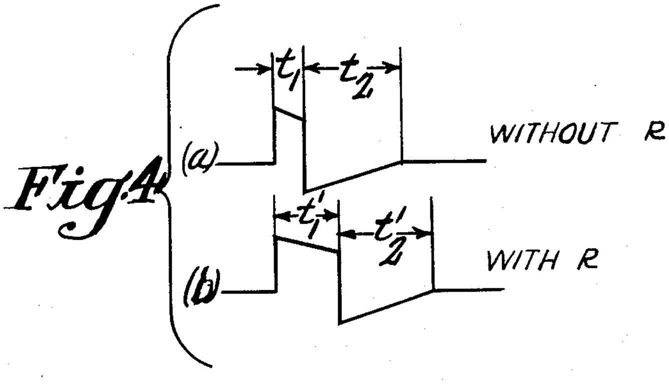
FIGURE 4 shows output voltage waveforms obtainable from the circuit of FIGURE 1.

The duration of the output pulse obtained from the output terminal 8 depends on the values of the resistance of the diode $D_1$, the inductance of the inductor L and the resistance of the resistor R. The resistor R may be omitted from the circuit, if desired. Waveform *a* of FIGURE 4 illustrates the output waveform obtained without the resistor R, and waveform *b* illustrates the output waveform when the resistor R is included. It is seen that the inclusion of the resistor R increases the width $t_1'$ of the output pulse (compared with the width $t_1$), without increasing the recovery time $t_2'$ (compared with recovery time $t_2$). The inclusion of the resistor R therefore improves the ratio of the pulse width $t_1$ to the recovery time $t_2$.

An input resistor $R_{in}$ is provided for coupling an input trigger pulse 12 from the input terminal 14 to the junction 16 between the coupling resistor $R_c$ and the second diode $D_2$.

Figure 2:
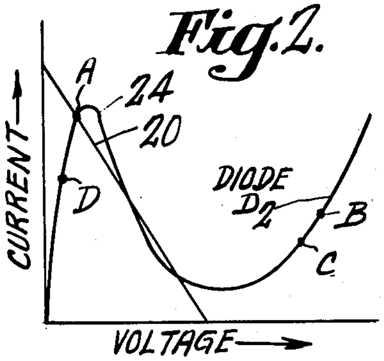
FIGURE 2 is a chart showing the characteristics of the second tunnel diode $D_2$ in the circuit of FIGURE 1.
Figure 3:
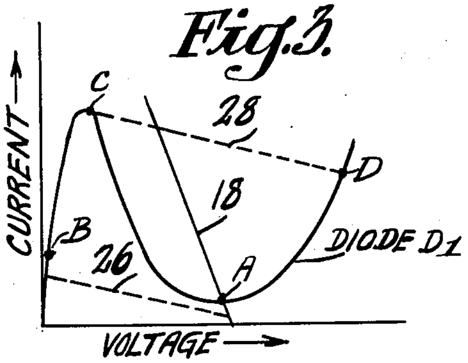
FIGURE 3 is a chart of the current-voltage characteristics of the first diode $D_1$ in the circuit of FIGURE 1.

In the operation of the two-diode monostable circuit of FIGURE 1, the diode $D_1$ has a current-voltage characteristic as shown in FIGURE 3 with a load line 18 providing a normal operating point A where the load line intersects the valley of the characteristic curve. The second diode $D_2$ has a current-voltage characteristic as shown in FIGURE 2 with a load line 20 which intersects the diode characteristic at the point A in the low voltage positive resistance region of the characteristic curve. The values of the direct current bias voltages +V and —V are selected in relation to characteristics of the diodes $D_1$ and $D_2$ so that when one diode is in its high voltage state, the other is forced into its low voltage state, and vice versa. Under normal conditions, in the absence of an input pulse, there is a high voltage drop across the first diode $D_1$ and a low voltage drop across the second diode $D_2$. A small current flows from terminal +V through diode $D_1$ to junction point 8, and a large current flows from ground through resistor R, inductor L, resistor $R_c$ and diode $D_2$ to the —V terminal. The initial or normal conditions of the circuit are designated A in the waveforms of FIGURE 1 and in the characteristic curve charts of FIGURES 2 and 3.

When an input trigger pulse 12 is applied to the positive input terminal 14, the pulse is coupled through the resistor $R_{in}$ to the junction point 16. This increases the current supplied to the diode $D_2$ and causes its operating point A (FIGURE 2) to rise over the peak 24 of its characteristic curve, encounter the negative resistance region of the characteristic curve, and switch toward an operating point B in the high voltage positive resistance region. The increased positive voltage at the point 16 results in a current which flows through the coupling resistor $R_c$ to the junction point 8 between the diode $D_1$ and the inductor L. The inductor L presents a very high impedance to any sudden change in current, with the result that the current flowing to the junction point 8 reduces the current flowing from the +V terminal through the diode $D_1$ to the junction point 8. This reduction of current available to the diode $D_1$ causes its operating point A (FIGURE 3) to switch rapidly along the dotted line 26 to the operating point B in the low voltage positive resistance region of its characteristic curve. The switching of diode $D_1$ starts before the switching of diode $D_2$ is completed. The operating point of diode $D_2$ (FIGURE 2) goes to point B, although this is not a point on the load line 24, because of the action of the other closely coupled diode $D_1$. The condition of the circuit following the leading edge of the trigger pulse 12 is thus one wherein the diode $D_1$ is in a low voltage state and diode $D_2$ is in a high voltage state.

As time passes following the switching of the diode $D_1$ to the operating point B in its low voltage state, the impedance of the inductor L to current flow therethrough decreases and permits an increasing current to flow from the bias terminal +V through the diode $D_1$, the inductor L and the resistor R to ground. The increasing current through the diode $D_1$ causes its operating point (FIGURE 3) to move up the characteristic curve to the peak C of the curve, at which time the negative resistance region is encountered and the operating point switches rapidly along the line 28 to the operating point D in the high voltage positive resistance region. During the time that the operating point of diode $D_1$ moves up from point B to point C (FIGURE 3), the operating point of diode $D_2$ moves from B to C (FIGURE 2), and the output voltage change is as represented by the output waveform in FIGURE 1 between the points designated B and C.

When the diode $D_1$ switches from its low voltage state at time C to its high voltage state at time D, less current flows in the path from the +V terminal through the diode $D_1$, the coupling resistor $R_c$ and the diode $D_2$. The decreased current supplied to the diode $D_2$ causes its operating point C (FIGURE 2) to move down to the left on its characteristic curve until the negative resistance region is encountered, at which time diode $D_2$ switches rapidly to the operating point D in the low voltage positive resistance region of its characteristic curve. The condition of the circuit is then one, at the time D, wherein diode $D_1$ is in a high voltage state and diode $D_2$ is in a low voltage state. Thereafter, a recovery period ensues during which the operating points of the diodes move from points D back to the initial normal points A. The circuit is then ready to be triggered again.

By way of example, the circuit elements of the monostable circuit of FIGURE 1 may have the following values:

| | |
|---|---|
| Resistors $R_{in}$, $R_c$, R | 120, 12, 3 ohms, resp. |
| Inductor L | 50 millimicrohenries. |
| Diode $D_1$ peak current | 50 milliamperes. |
| Diode $D_2$ peak current | 15 milliamperes. |
| Load (not shown) | 15 ohms. |
| Bias voltage +V | +400 millivolts. |
| Bias voltage −V | −200 millivolts. |

The coupling resistor $R_c$ preferably has a small value such as 12 ohms so that the diodes $D_1$ and $D_2$ are tightly coupled to each other. The two diodes therefore cooperate in an interacting manner to provide a circuit having a relatively large logic gain.

What is claimed is:

1. In combination, high-voltage, intermediate-voltage and low-voltage direct current bias terminals, a series circuit including a first tunnel diode, an output terminal, a coupling resistor and a second tunnel diode connected between said high-voltage and low-voltage bias terminals, an inductor connected between said output terminal and said intermediate-voltage terminal, and means to apply an input signal to said second tunnel diode.

2. In combination, high-voltage, intermediate-voltage and low-voltage direct current bias terminals, a series circuit including a first tunnel diode, an output terminal, a coupling resistor and a second tunnel diode connected between said high-voltage and low-voltage bias terminals, an inductor and a resistor connected in series between said output terminal and said intermediate-voltage terminal, and means to apply an input signal to said second tunnel diode.

3. A two-diode monostable circuit comprising first, intermediate and second direct current bias terminals, a series circuit including a first tunnel diode, a coupling resistor, and a second tunnel diode connected between said first and second bias terminals, said diodes being poled in the same direction and being biased so that when one is in a high voltage state the other is in a low voltage state and vice versa, an inductor connected from said intermediate bias terminal to said first tunnel diode to therewith form a monostable circuit wherein said first tunnel diode is normally biased in a high voltage state in the valley of its characteristic curve, and means to apply an input trigger pulse to said second diode.

4. A two-diode monostable circuit comprising first, intermediate and second direct current bias terminals, a series circuit including a first negative resistance diode, a coupling resistor, and a second negative resistance diode connected between said first and second bias terminals, said diodes being poled in the same direction and being biased so that when one is in a high voltage state the other is in a low voltage state and vice versa, an inductor connected from said intermediate bias terminal to said first diode to therewith form a monostable circuit wherein said first diode is normally biased in a high voltage state in the valley of its characteristic curve, and means to apply an input trigger pulse to said second diode.

5. A two-diode monostable circuit comprising relatively high-voltage, intermediate-voltage and low-voltage direct current bias terminals, a first tunnel diode and an inductor connected between said high-voltage and intermediate-voltage terminals to form a monostable circuit, a coupling resistor and a second tunnel diode connected in series from the junction between said first diode and inductor to said low-voltage terminal, said circuit elements being chosen so that said first diode is normally biased in a high voltage state in the valley of its characteristic curve and said second diode is normally biased in a low voltage state, and means to apply an input trigger pulse to said second diode to switch it to a high voltage state, whereby the second diode switches the first diode to a low voltage state, and thereafter the first diode returns to its high voltage state and returns the second diode to its low voltage state.

6. A two-diode monostable circuit comprising relatively high-voltage, intermediate-voltage and low-voltage direct current bias terminals, a first negative resistance diode and an inductor connected between said high-voltage and intermediate-voltage terminals to form a monostable circuit, a coupling resistor and a second negative resistance diode connected in series from the junction between said first diode and inductor to said low-voltage terminal, said circuit elements being chosen so that said first diode is normally biased in a high voltage state in the valley of its characteristic curve and said second diode is normally biased in a low voltage state, and means to apply an input trigger pulse to said second diode to switch it to a high voltage state, whereby the second diode switches the first diode to a low voltage state, and thereafter the first diode returns to its high voltage state and returns the second diode to its low voltage state.

7. A monostable circuit comprising a first tunnel diode and an inductor connected in series, means to bias said series circuit for operation in a monostable manner, a second tunnel diode coupled to said first tunnel diode, means to bias said second tunnel diode in relation to the first tunnel diode so that when one is in its high voltage state the other must be in its low voltage state, and vice versa, means to apply an input signal to said second tunnel diode and means to derive an output signal from said first tunnel diode.

References Cited in the file of this patent

UNITED STATES PATENTS

| | | |
|---|---|---|
| 2,614,140 | Kreer | Oct. 14, 1952 |
| 2,975,377 | Price | Mar. 14, 1961 |

OTHER REFERENCES

AIEE Conference Paper "Tunnel Diode Circuit Aspects and Applications," January 1960, pages 16 and 28.